(12) United States Patent
Zhai et al.

(10) Patent No.: US 8,089,281 B2
(45) Date of Patent: Jan. 3, 2012

(54) DOUBLY RESONANT HIGH FIELD RADIO FREQUENCY SURFACE COILS FOR MAGNETIC RESONANCE

(75) Inventors: Zhiyong Zhai, Mayfield Heights, OH (US); Michael A. Morich, Mentor, OH (US); Gordon D. DeMeester, Wickliffe, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 197 days.

(21) Appl. No.: 12/528,541

(22) PCT Filed: Jan. 30, 2008

(86) PCT No.: PCT/IB2008/050328
§ 371 (c)(1),
(2), (4) Date: Aug. 25, 2009

(87) PCT Pub. No.: WO2008/104895
PCT Pub. Date: Sep. 4, 2008

(65) Prior Publication Data
US 2010/0026303 A1 Feb. 4, 2010

Related U.S. Application Data

(60) Provisional application No. 60/891,539, filed on Feb. 26, 2007.

(51) Int. Cl.
*G01V 3/00* (2006.01)
(52) U.S. Cl. ..................... 324/318; 324/322
(58) Field of Classification Search .................. 324/318, 324/322
See application file for complete search history.

(56) References Cited

U.S. PATENT DOCUMENTS

| | | | |
|---|---|---|---|
| 4,783,641 A * | 11/1988 | Hayes et al. | 333/219 |
| 4,928,064 A | 5/1990 | Keren | |
| 5,202,635 A | 4/1993 | Srinivasan et al. | |
| 5,557,247 A | 9/1996 | Vaughn, Jr. | |
| 5,898,306 A | 4/1999 | Liu et al. | |
| 6,396,271 B1 | 5/2002 | Burl et al. | |
| 6,400,154 B2 * | 6/2002 | Tomanek et al. | 324/318 |
| 6,822,448 B2 | 11/2004 | Watkins et al. | |
| 7,119,541 B2 | 10/2006 | Barberi | |
| 7,733,092 B2 * | 6/2010 | Otake et al. | 324/322 |
| 2006/0158189 A1 | 7/2006 | Saylor et al. | |

FOREIGN PATENT DOCUMENTS

| | | |
|---|---|---|
| EP | 1122549 A1 | 8/2001 |
| JP | 07303623 A | 11/1995 |
| WO | 2005050239 A1 | 6/2005 |
| WO | 2005076029 A1 | 8/2005 |
| WO | 2005111646 A1 | 11/2005 |
| WO | 2005124381 A2 | 12/2005 |
| WO | 2006120588 A1 | 11/2006 |

OTHER PUBLICATIONS

Ong, K. C., et al.; Radiofrequency Shielding of Surface Coils at 4.0T; 1995; JMRI; vol. 5; pp. 773-777.

(Continued)

*Primary Examiner* — Louis Arana

(57) ABSTRACT

A radio frequency coil comprises an annular conductor or parallel annular conductors (22, 22c, 22d) configured to support: (i) a uniform electrical current distribution generating a first $B_1$ field ($B_{1,uniform}$) at a first magnetic resonance frequency directed out of a plane of the annular conductor or conductors; and (ii) a sinusoidal electrical current distribution generating a second $B_1$ field ($B_{1,sine}$) at a second magnetic resonance frequency directed parallel with the plane of the annular conductor or conductors. A magnetic resonance scanner comprises: a magnet (10) generating a static magnetic field ($B_0$); a magnetic field gradient system (14) configured to superimpose selected magnetic field gradients on the static magnetic field; and said radio frequency coil including said annular conductor or parallel annular conductors (22, 22c, 22d).

23 Claims, 11 Drawing Sheets

OTHER PUBLICATIONS

Figure 1:
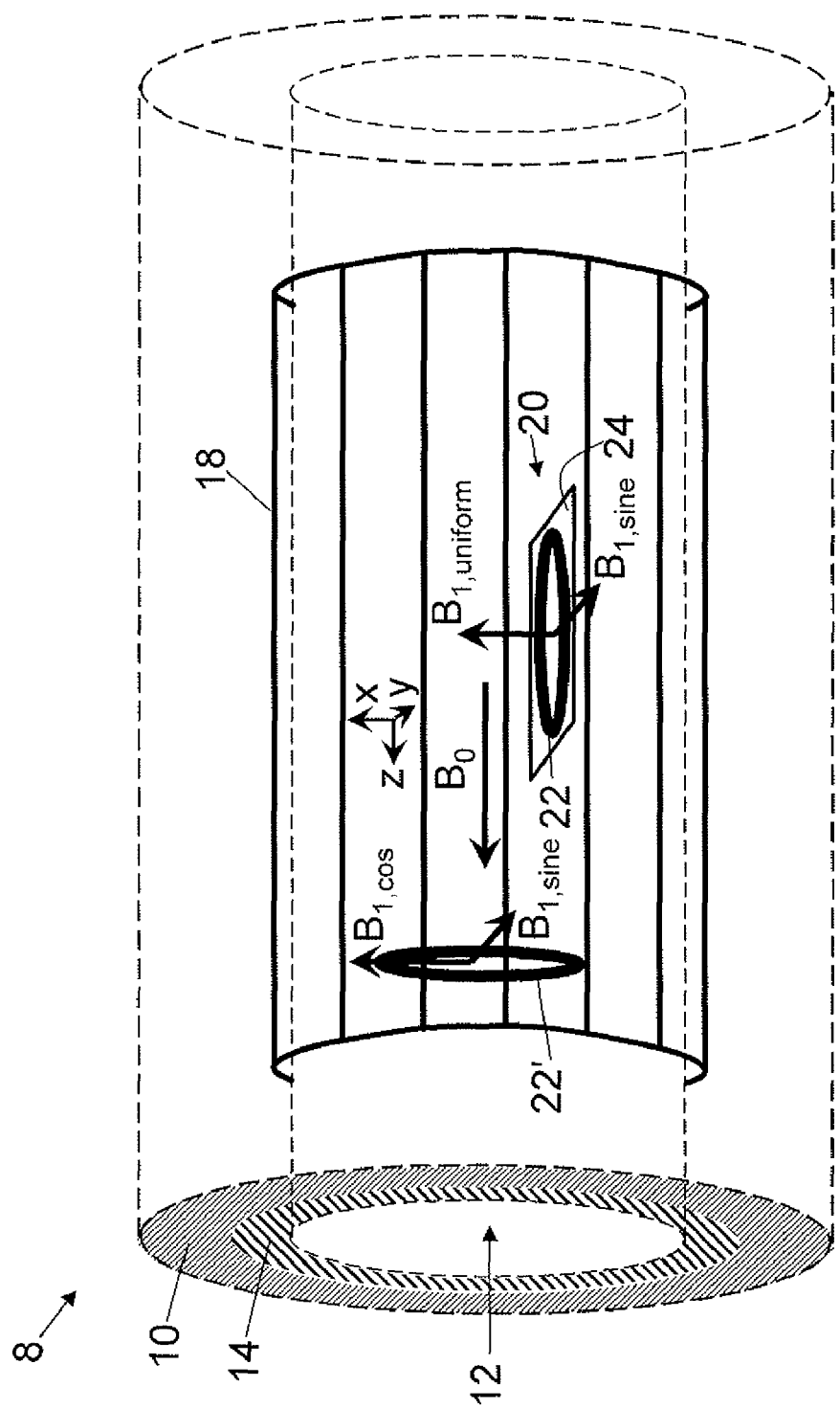

Peshkovsky, A., et al.; Sensitivity Enhancement and Compensation of RF Penetration Artifact with Planar Actively Detunable Quadrature Surface Coil; 2006; MRI; 24:81-87.

Zhai, Z., et al.; Ring Structures RF Coils for Ultra-High Field MRI; 2007; Proc. Intl. Soc. Mag. Reson. Med.; 15:3276.

Zhang, X., et al.; Microstrip RF Surface Coil Design for Extremely High-Field MRI and Spectroscopy; 2001; MRM; 46:443-450.

Zhang, X., et al.; Higher-Order Harmonic Transmission-Line RF Coil Design for MR Applications; 2005; MRM; 53:1234-1239.

* cited by examiner

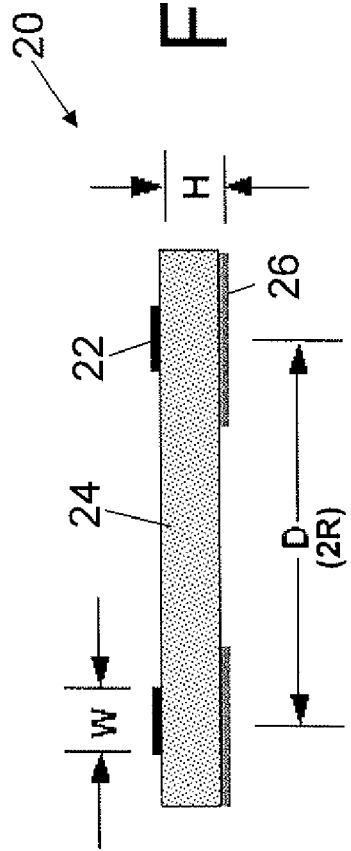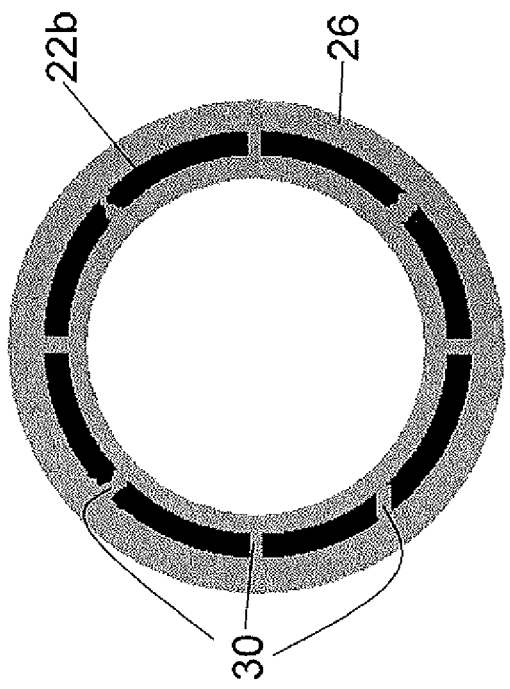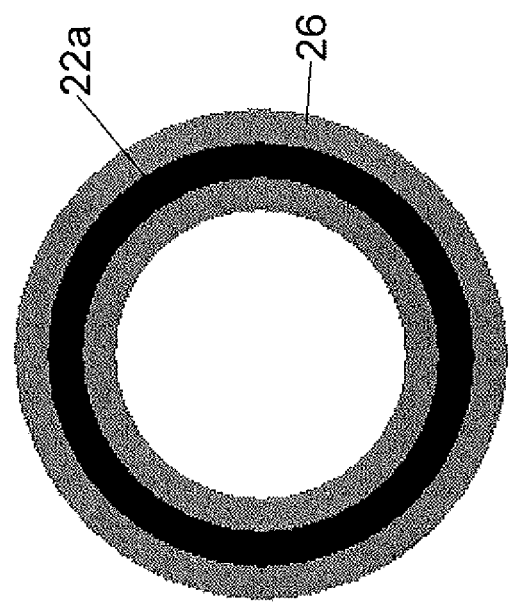

DOUBLY RESONANT HIGH FIELD RADIO FREQUENCY SURFACE COILS FOR MAGNETIC RESONANCE

The following relates to the magnetic resonance arts. It finds particular application in magnetic resonance imaging at high magnetic fields (e.g., about 3 Tesla or higher), and is described with particular reference thereto. However, the following finds more general application in magnetic resonance imaging, magnetic resonance spectroscopy, and the like performed at substantially any magnetic field.

Surface coils are known and used in the magnetic resonance arts to excite or detect magnetic resonance in a localized region of a subject. Surface coils typically include a single annular conductive loop or an array of planar conductive loops positioned close to the region of interest of a subject. An electric current driven through the single annular conductive loop or loops arrangement generates a $B_1$ field oriented transverse to $B_0$ field and the plane of the coil loop or loops. Conversely, in a readout mode a $B_1$ field oriented transverse to the $B_0$ field and the plane of the coil loop or loops induces an electric current in the coil loop or loops that can be used to detect magnetic resonance. The butterfly or figure-eight surface coil is also known. This coil produces a $B_1$ field oriented transverse to $B_0$ field and parallel to the plane of the surface coil. In application, one or more such surface coils are placed close to or on a patient or other subject, such that the close proximity of the surface coil or coils enhances radio frequency coupling and magnetic resonance signal strength.

In spite of these advantages of existing surface coils, some problems remain. One difficulty is that the number of surface coils used in a given study can become problematic. Each surface coil operates at a single magnetic resonance frequency, and so multi-nuclear studies require use of multiple surface coils tuned to the magnetic resonance frequencies of different nuclear species of interest. Since the coils are in close proximity to or contact or rest upon the patient, a large number of surface coils can be uncomfortable and intimidating to the patient. The number of surface coils installed at any given time can be reduced by swapping surface coils in and out as needed; however, this is done at the expense of increased imaging session duration and increased risk of positioning errors in the placement of the surface coils.

Another difficulty with existing loop surface coils is that they operate in a uniform resonance mode in which the $B_1$ field is oriented transverse to the coil plane. Such a loop coil is most effective when oriented such that the static $B_0$ magnetic field is in the plane of the surface coil, so as to maximize the angle between the $B_0$ and $B_1$ fields. In contrast, birdcage and TEM coils are generally cylindrical volume coils that couple with an interior region surrounded by the birdcage or TEM coil and are oriented with their axis generally aligned with the $B_0$ field. Hence, these coils are not suitable for use as surface coils.

The following provides new and improved apparatuses and methods which overcome the above-referenced problems and others.

In accordance with one aspect, a generally planar surface coil is disclosed, comprising one or two annular conductors arranged generally parallel with a coil plane of the generally planar radio frequency coil and configured to support (i) a uniform electrical current distribution generating a first $B_1$ field at a first magnetic resonance frequency directed out of the coil plane, and (ii) a sinusoidal electrical current distribution generating a second $B_1$ field at a second magnetic resonance frequency directed parallel with the coil plane.

In accordance with another aspect, a radio frequency coil is disclosed, comprising an annular conductor configured to support: (i) a uniform electrical current distribution generating a first $B_1$ field at a first magnetic resonance frequency directed out of a plane of the annular conductor; and (ii) a sinusoidal electrical current distribution generating a second $B_1$ field at a second magnetic resonance frequency directed parallel with the plane of the annular conductor.

In accordance with another aspect, a magnetic resonance scanner is disclosed, comprising: a magnet generating a static magnetic field; a magnetic field gradient system configured to superimpose selected magnetic field gradients on the static magnetic field; and an annular conductor configured to support a sinusoidal electrical current distribution generating or induced by a $B_1$ field at a magnetic resonance frequency directed parallel with the plane of the annular conductor.

One advantage resides in obtaining a dual resonance from a single surface coil.

Another advantage resides in facilitating the use of fewer surface coils during magnetic resonance data acquisition.

Another advantage resides in providing a quadrature surface coil.

Another advantage resides in providing a doubly-tuned surface coil for multi-nuclear magnetic resonance data acquisitions.

Still further advantages of the present invention will be appreciated to those of ordinary skill in the art upon reading and understand the following detailed description.

FIG. 1 diagrammatically shows a magnetic resonance scanner including a surface coil configured to support both uniform and sinusoid resonances at the same or at different magnetic resonance frequencies.

Figure 2:
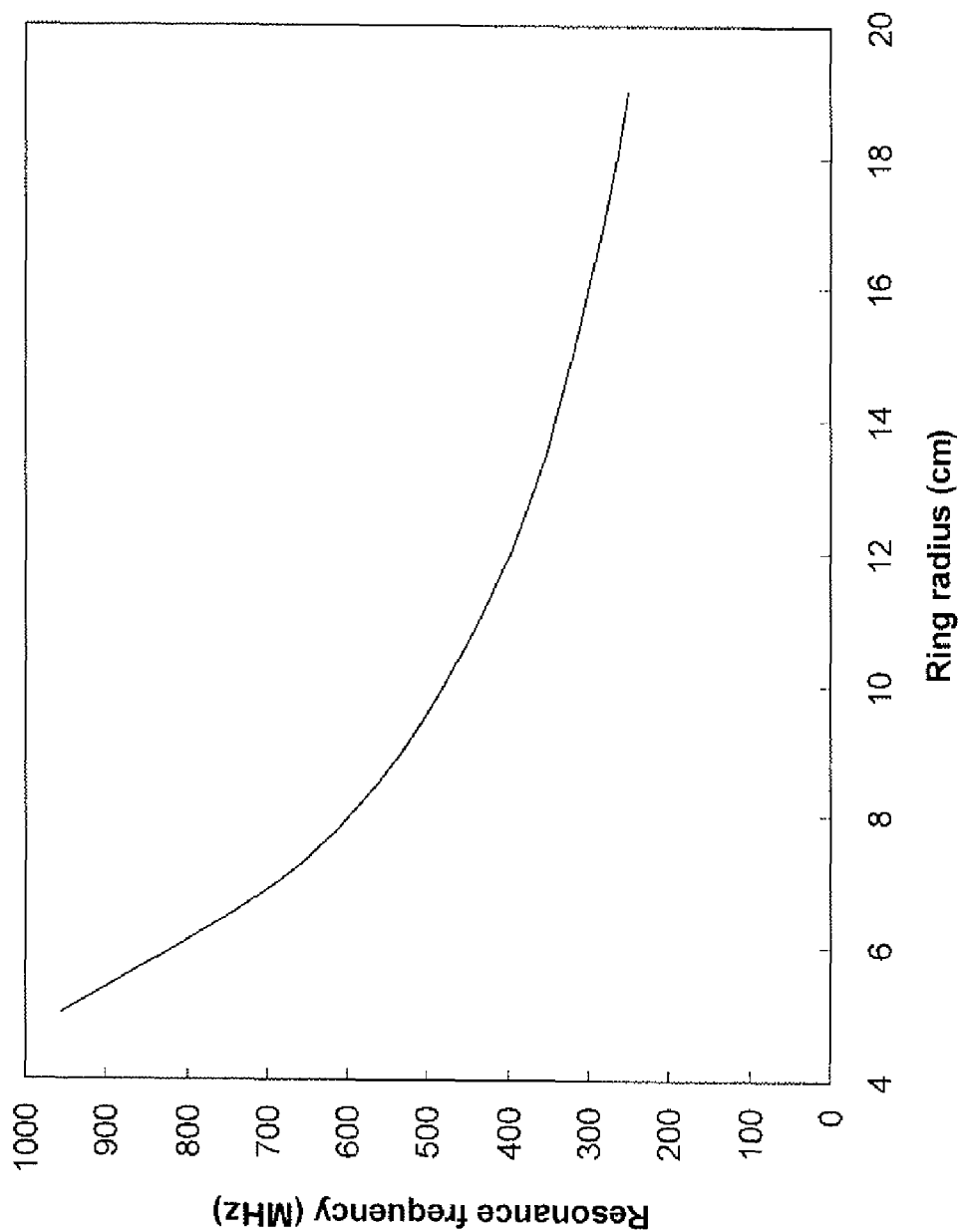

FIG. 2 plots sinusoidal resonance frequency for a continuous unshielded circular annular conductor without intervening capacitance or inductance elements, as a function of radius of the circular annular conductor.

Figure 3:
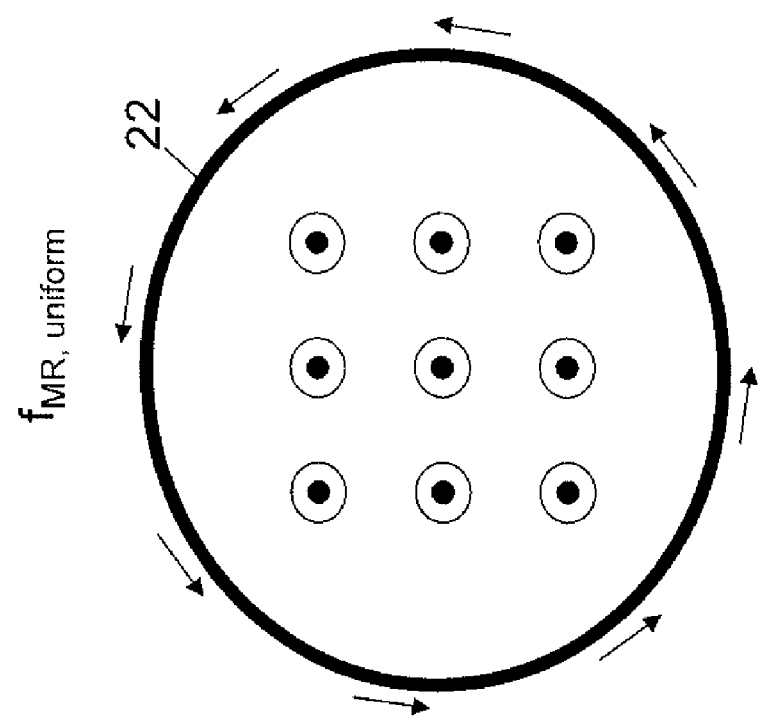

FIG. 3 diagrammatically shows the uniform resonance mode of the annular conductor of the surface coil of FIG. 1.

Figure 4:
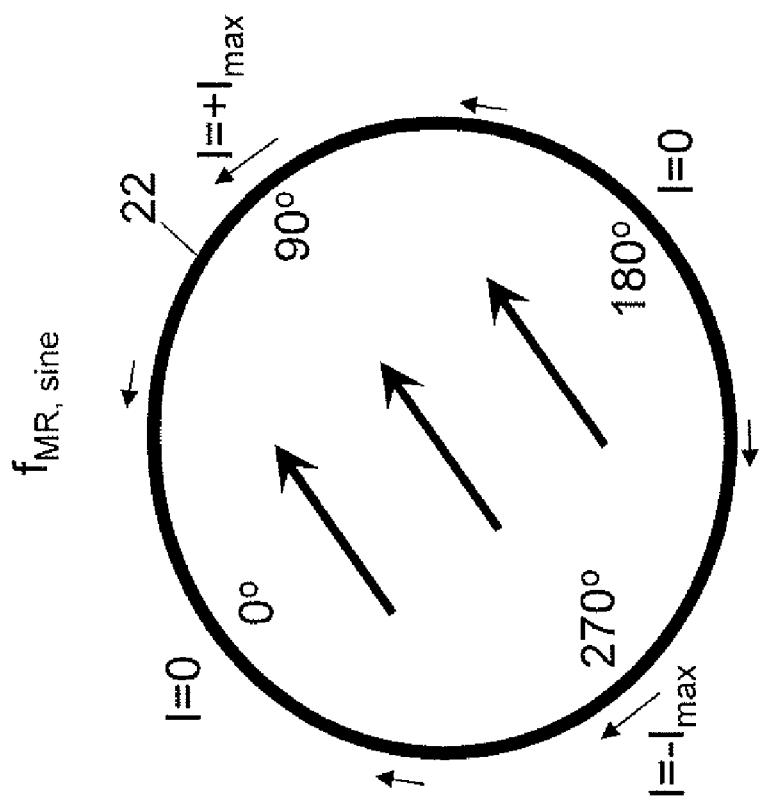

FIG. 4 diagrammatically shows the sinusoidal resonance mode of the annular conductor of the surface coil of FIG. 1.

FIG. 5 diagrammatically shows a side sectional view of one embodiment of the surface coil of FIG. 1.

FIG. 6 diagrammatically shows a plan view of an embodiment of the surface coil of FIG. 1 that includes a continuous closed-loop microstrip transmission line annular conductor.

FIG. 7 diagrammatically shows a plan view of an embodiment of the surface coil of FIG. 1 that includes a segmented closed-loop microstrip transmission line annular conductor having gaps defining discrete capacitance elements.

Figure 8:
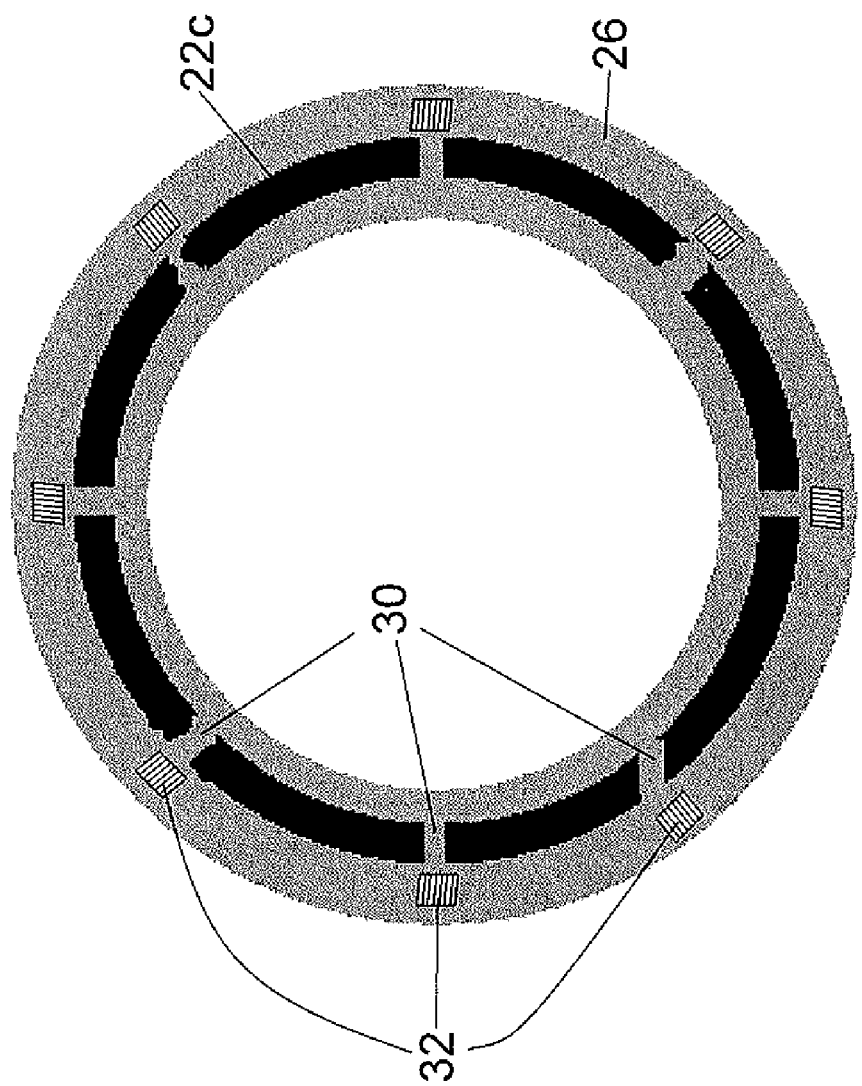

FIG. 8 diagrammatically shows a plan view of an embodiment of the surface coil of FIG. 1 that includes a segmented closed-loop microstrip transmission line annular conductor having gaps defining capacitance elements, further including series inductor elements.

Figure 9:
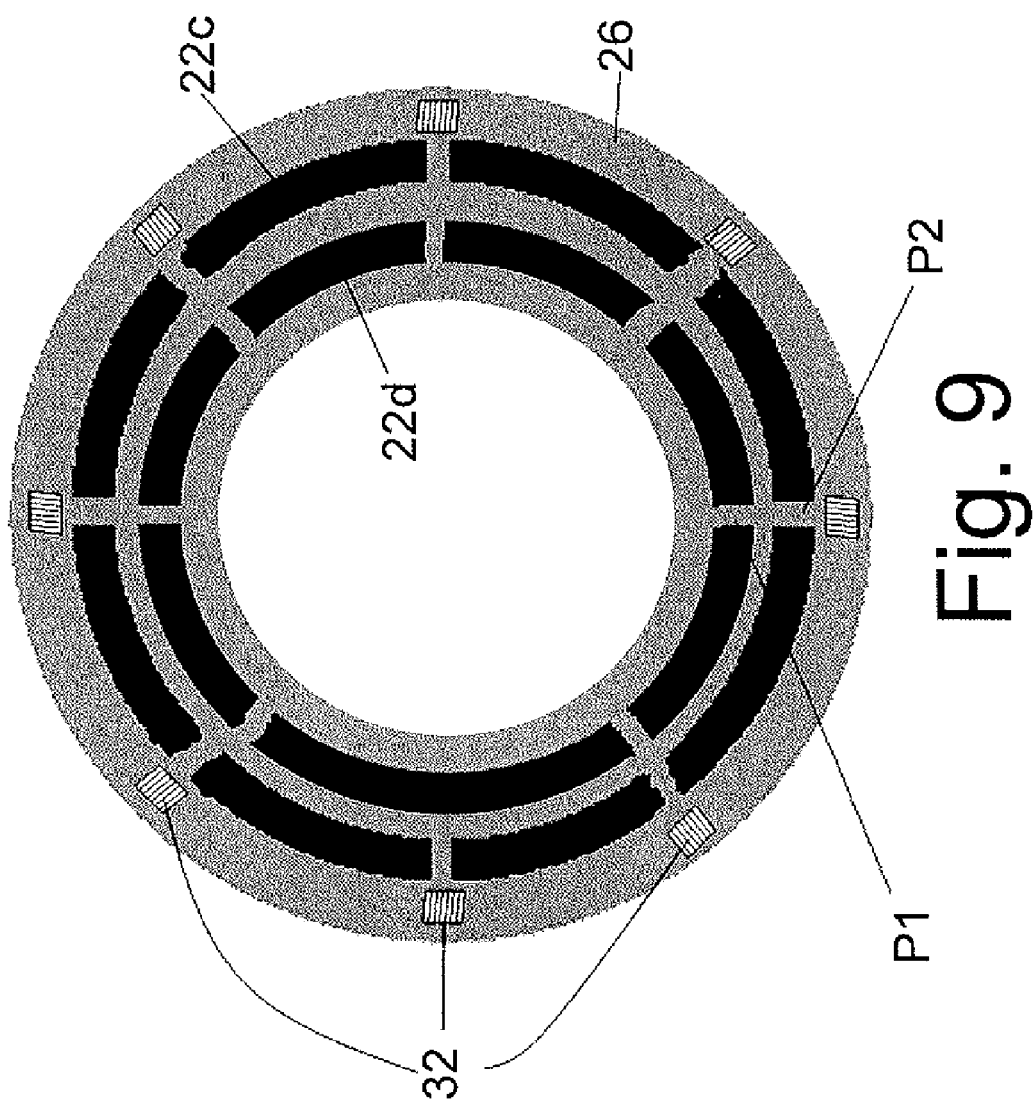

FIG. 9 diagrammatically shows a plan view of a generally planar radio frequency coil that includes two parallel segmented closed-loop microstrip transmission line annular conductors each having gaps defining capacitance elements, one of which further includes series inductor elements.

Figure 10:
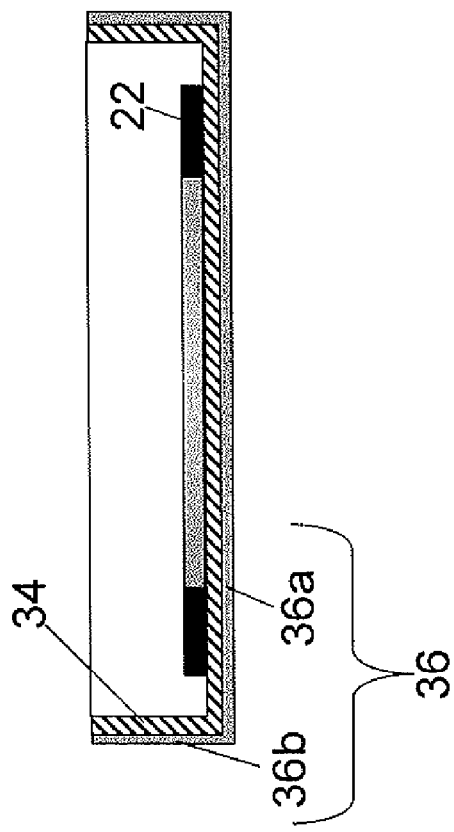
Figure 11:
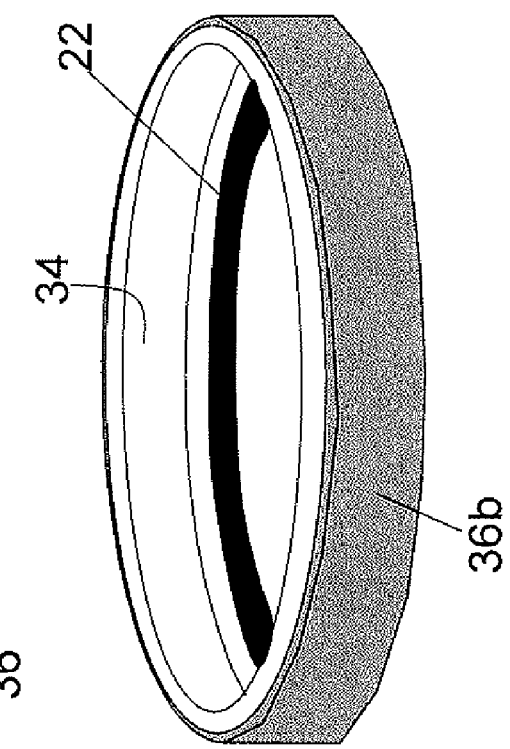

FIGS. 10 and 11 diagrammatically show side sectional and perspective views, respectively, of an embodiment of the surface coil of FIG. 1 that includes an annular conductor shielded by both a planar radio frequency shield and by a transverse annular shield portion.

Figure 12:
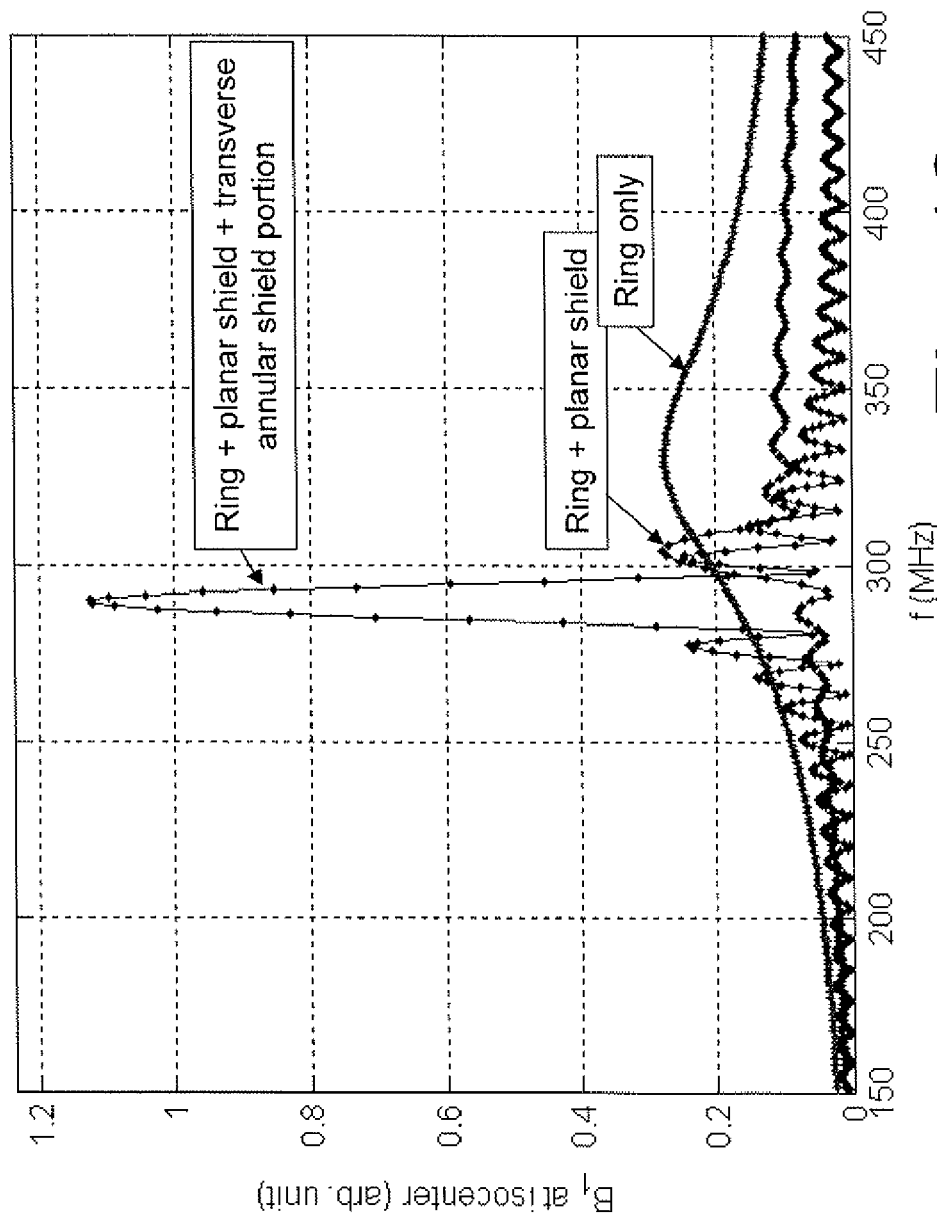

FIG. 12 plots calculated transverse $B_1$ field versus frequency at a point 10 centimeters above a 15-centimeter radius circular annular conductor for (i) an unshielded annular conductor ("ring-only"); (ii) an annular conductor shielded by a planar radio frequency shield ("ring+planar shield"); and (iii) an annular conductor shielded by both a planar radio frequency shield and by a transverse annular shield portion ("ring+planar shield+transverse annular shield portion").

Figure 14:
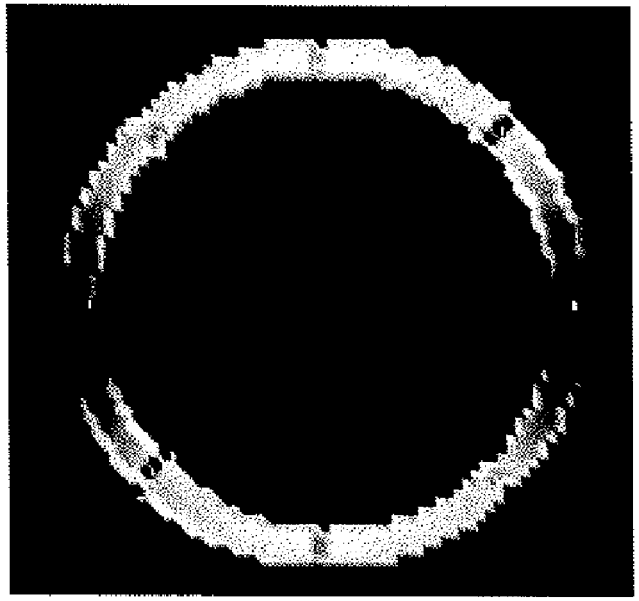
Figure 13:
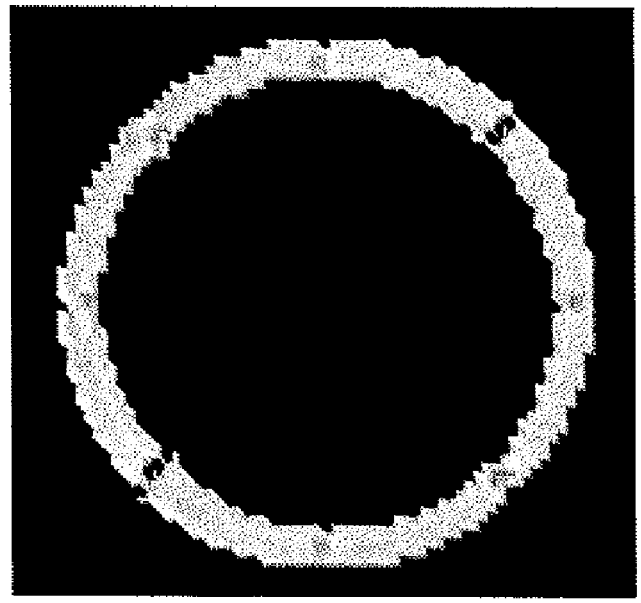
Figure 15:
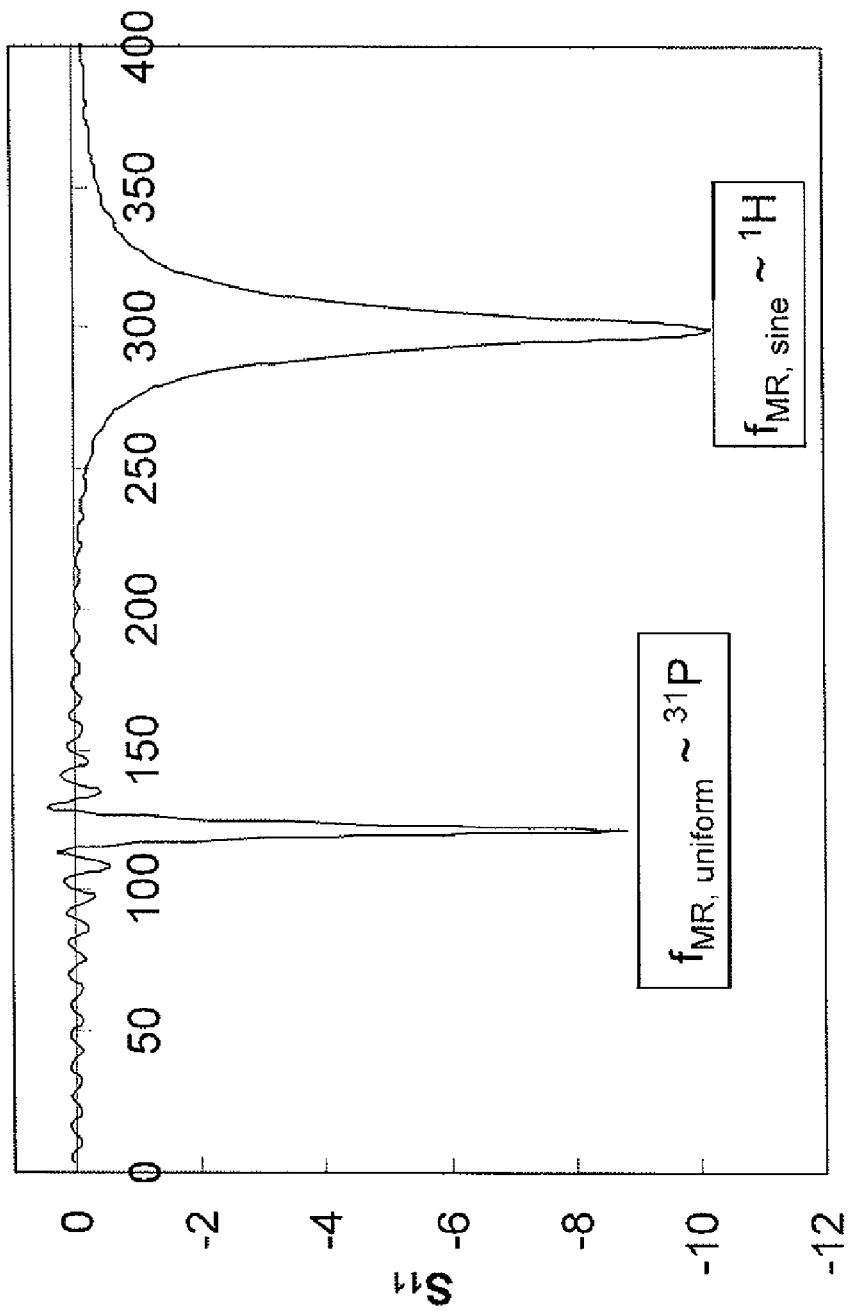

FIGS. 13-16 plot calculated parameters for uniform and sinusoidal resonance modes, respectively, for a circular annular conductor similar to that of FIG. 8 having a diameter of 14 centimeters, annular conductor width of 1 centimeter, and a dielectric substrate having thickness of 1.5 centimeters and dielectric constant $\in_r=2.1$, having eight capacitance elements in series with inductive elements tuned to support a uniform current density at a magnetic resonance frequency of 120.7 MHz (corresponding to $^{31}P$ in a 7 Tesla static $B_0$ magnetic field) and tuned to support a sinusoidal current density at a magnetic resonance frequency of 298 MHz (corresponding to $^1H$ in a 7 Tesla static $B_0$ magnetic field). More particularly:

FIGS. 13 and 14 plot calculated current distribution along an annular conductor for the uniform and sinusoidal resonance modes, respectively;

FIG. 15 plots calculated $S_{11}$ versus frequency; and

Figure 16:
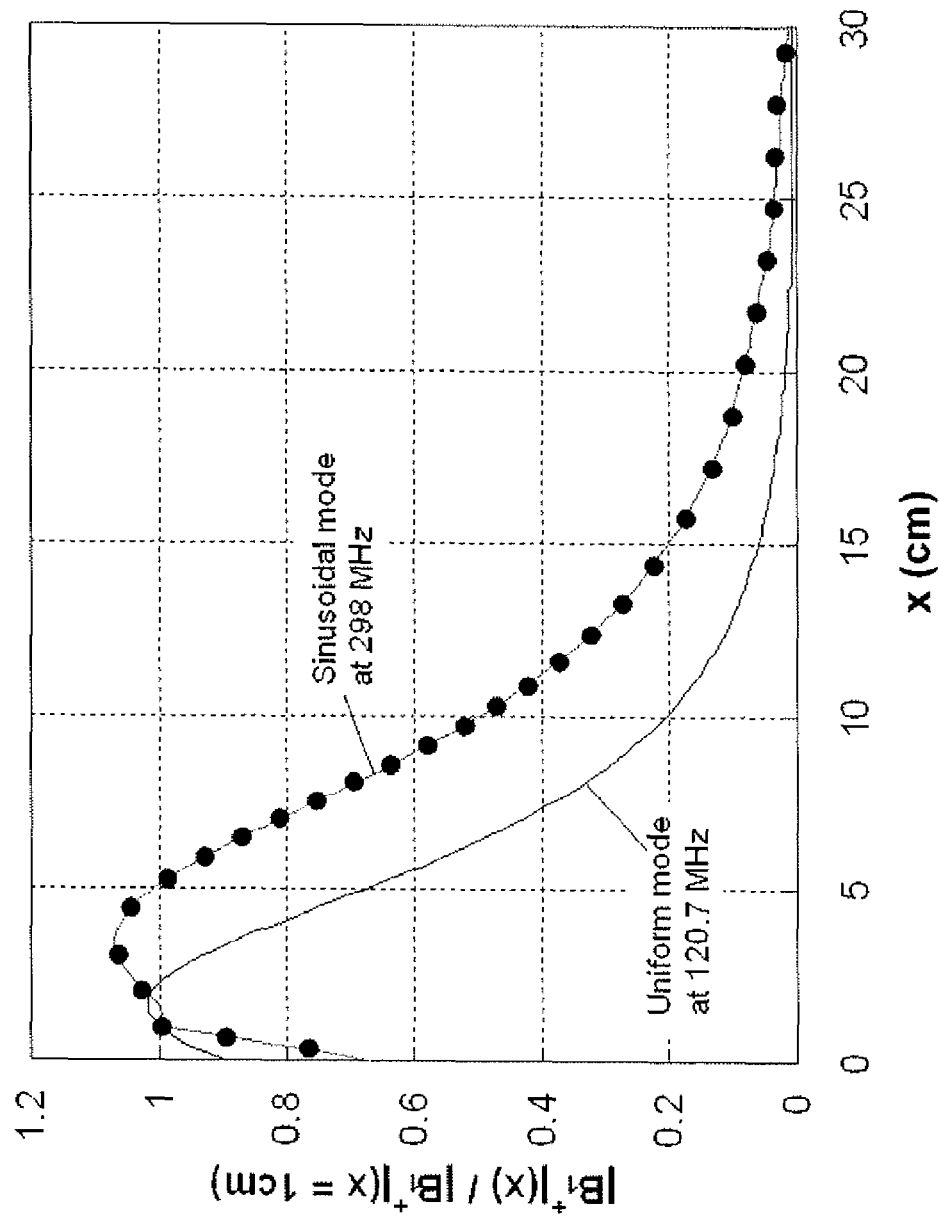

FIG. 16 plots calculated $|B_1^+|(x)$ normalized to the value of $|B_1^+|(x=1$ centimeter$)$ versus position along the coil axis direction in an average brain tissue.

With reference to FIG. 1, an illustrative bore-type magnetic resonance scanner 8 includes a magnet 10 generating a static magnetic field $B_0$ oriented parallel with a bore opening 12 of the scanner 8. The magnet 10 can be a superconducting or resistive magnet. Other geometries besides the illustrated horizontal bore geometry can be implemented. The magnetic resonance scanner 8 further includes a magnetic field gradient system 14 configured to superimpose selected magnetic field gradients on the static magnetic field $B_0$. In some embodiments, the magnetic field gradient system 14 includes windings for selectively generating three orthogonal magnetic field gradients, for example along orthogonal designated x-, y-, and z-directions. Typically, the magnetic field gradient system is disposed inside of the magnet, as the illustrated magnetic field gradient system 14 is disposed inside of the illustrated magnet 10; however, other configurations are also contemplated, such as an arrangement disclosed in Overweg, Int'l Appl. No. WO 2005/124381 in which the gradient coil windings are disposed outside of the magnet and the generated magnetic field gradients are coupled into the bore opening by a ferromagnetic yoke. In FIG. 1, the magnet 10 and magnetic field gradient system 14 are diagrammatically shown as transparent to reveal the interior of the bore opening 12.

In operation, one or more radio frequency coils, such as an illustrative birdcage-type whole-body coil 18 integrated into the scanner 8, or a transverse electromagnetic (TEM) coil (not shown), or a surface coil 20, or the like, is energized by a suitable radio frequency signal at one or more magnetic resonance frequencies to excite magnetic resonance in one or more nuclear species, such as the $^1H$, $^{13}C$, $^{31}P$, $^{23}Na$, $^{19}F$, or other nuclear species. One or more magnetic field gradients are typically applied by the magnetic field gradient system 14 to spatially limit and/or encode the excited magnetic resonance or resonances. The excited magnetic resonances are read out by one or more of the radio frequency coils 18, 20. The readout or receive coil may be the same or different from the radio frequency coil used for excitation.

The surface coil 20 includes an annular conductor 22 configured to support: (i) a uniform electrical current distribution generating a first, $B_{1,uniform}$ field at a first magnetic resonance frequency directed out of a plane of the annular conductor 22; and (ii) a sinusoidal electrical current distribution generating a second, $B_{1,sine}$ magnetic field at a second magnetic resonance frequency directed parallel with the plane of the annular conductor 22. This dual-mode configuration advantageously allows the surface coil 20 to be used as a doubly-tuned surface coil if the first and second magnetic resonance frequencies are different. An example of an application of such a doubly-tuned surface coil is multi-nuclear magnetic resonance imaging or spectroscopy, in which the first and second magnetic resonance frequencies are suitably magnetic resonance frequencies of different nuclear species in a given static magnetic field $B_0$.

FIG. 1 also diagrammatically shows an annular conductor 22' that is similar to the annular conductor 20, but is oriented with the axis of the annular conductor 22' parallel with the static magnetic field $B_0$. In other words, the direction of the $B_0$ field is transverse to the plane of the annular conductor 22'. In this arrangement, the annular conductor 22' can be used as a quadrature transmit/receive coil by exciting it using two sinusoidal modes that are phase-shifted by 90° at the same magnetic resonance frequency. For example, the illustrated annular conductor 22' suitably supports $B_{1,sine}$ and $B_{1,cos}$ fields. This dual-mode configuration advantageously allows the surface coil 20 to be used as a quadrature surface coil.

With reference to FIG. 2, heretofore the sinusoidal mode of a continuous unshielded annular conductor has not been considered to be of value for magnetic resonance imaging or spectroscopy, because the resonance frequency was deemed to be too high and the generated $B_1$ field was deemed to be too non-uniform. However, the inventors have recognized that for high-field magnetic resonance and for an annular conductor of sufficiently large radius, the sinusoidal mode oscillates at a useful frequency range matching certain magnetic resonance frequencies of interest. For instance, the $^1H$ magnetic resonance frequency is 298 MHz in a static magnetic field $B_0$ of 7 Tesla. As indicated in FIG. 2, the sinusoidal resonance of a circular annular conductor having a reasonable diameter of about 32 centimeters ($c/298$ MHz$/\pi$) closely matches this $^1H$ magnetic resonance frequency. Moreover, the inventors have recognized that at higher magnetic field, the spatial uniformity is largely determined by the dielectric and conductive characteristics of the patient or other subject loading the coil; hence, at static $B_0$ magnetic field values greater than 3 Tesla, the relatively large unloaded non-uniformity of the $B_{1,sine}$ field is acceptable.

With reference to FIG. 3, the uniform oscillation mode of the annular conductor 22 of the surface coil 20 of FIG. 1 is illustrated. In the uniform mode the current distribution is uniform around the annular conductor 22. This mode does not require a circular annulus, and is typically tuned using capacitance elements in the conductor. The $B_1$ field generated by the current depends on position with respect to the loop. In FIG. 3, the reference direction is counterclockwise; however, the uniform current distribution oscillates temporally between clockwise and counterclockwise at the first magnetic resonance frequency of the uniform oscillation. The uniform current distribution produces a $B_{1,uniform}$ field directed transverse to or out of the plane of the annular conductor 22. At the point of time illustrated in FIG. 3, the illustrated $B_{1,uniform}$ field is directed out of the page of the paper corresponding to the counterclockwise reference direction of the uniform current distribution.

FIG. 4 shows the sinusoidal oscillation mode of the annular conductor 22 of the surface coil 20 of FIG. 1. The current distribution around the circular annular conductor 22 is sinusoidal with a spatial period equal to the circumference of the annular conductor 22. Accordingly, at the resonance frequency where the current distribution wavelength coincides with the ring circumference there are two current distribution nulls, one maximum positive current amplitude point, and one maximum negative current amplitude point. At the time instant illustrated in FIG. 4, the two current distribution nulls are positioned at points designated as 0° and 180°, the maximum positive current amplitude (+$I_{max}$) point is at 90°, and the maximum negative current amplitude point (−$I_{max}$) is at 270°. The resulting $B_{1,sine}$ field is directed parallel with the plane of the annular conductor 22.

The configuration of the annular conductor 22 of the surface coil 20 is such as to support both the uniform and sinusoidal oscillations current modes and their associated magnetic fields simultaneously. Thus, the same surface coil 20 can be used to simultaneously generate or detect $B_1$ fields at both the first and second magnetic resonance frequencies. If the first and second magnetic resonance frequencies are different, the surface coil 20 can be used to excite or acquire multi-nuclear magnetic resonance simultaneously.

FIG. 5 shows one suitable implementation of the surface coil 20, in which the annular conductor 22 is configured as an annular microstrip transmission line on a generally planar dielectric substrate 24. A ground plane 26 or other planar radio frequency shield is arranged parallel with the annular conductor 22 disposed on a side of the dielectric substrate 24 opposite the annular conductor 22. The presence of the shield 26 advantageously boosts the Q factor of the coil. In these embodiments, the annular conductor 22 and the ground plane 26 are suitably lithographically or otherwise patterned or selectively deposited conductive films.

In the illustrated configuration of FIG. 5, the ground plane 26 is an annular ground plane; however, a disk-shaped or other larger-area ground plane or radio frequency shield can be used instead. For example, a ground plane can be used that covers the backside of the dielectric substrate 24 but is suitably segmented to reduce gradient induced eddy currents, yet appears continuous at radio frequency via capacitive connections. FIG. 5 also indicates certain geometrical parameters that affect the tuning of the coil, such as the annular conductor diameter D, the thickness H of the dielectric substrate 24, and the width W of the annular conductor 22. The designation of diameter D for the annular conductor 22 assumes a circular configuration for the annular conductor. In some embodiments, the annular conductor is contemplated to deviate somewhat from perfect circularity, and may for example be somewhat elliptical or so forth. However, substantial deviation from circularity is generally disadvantageous in that it can adversely affect uniformity of the $B_{1,sine}$ field. It should also be noted that the diameter D corresponds to twice the radius, i.e. 2R, as also indicated in FIG. 5.

With reference to FIGS. 6-8, the annular conductor 22 can have various configurations with differing degrees of freedom for tuning. FIGS. 6-8 show plan views of various surface coil embodiments each employing the cross-sectional configuration of FIG. 5. In the plan views of FIGS. 6-8, the dielectric substrate 24 is not shown, so that the annular conductor is seen on top of the ground plane 26. In practice, the dielectric substrate 24 may be opaque, transparent, or translucent.

In the configuration of FIG. 6, the annular conductor is a continuous closed annular conductor 22a. In this arrangement, the first uniform mode is absent and only the second sinusoidal mode is useable. The tuning of the sinusoidal mode is through the parameters D, W, and H. This makes it difficult to fine-tune the sinusoidal mode; however, in some cases a suitable geometry can be obtained to achieve a specific selected magnetic resonance frequency value. Although the annular conductor 22a is referred to herein as a closed annular conductor, it is to be appreciated that the closed annular conductor 22a may include a gap (not shown) in the annular conductor in order to feed the coil with a suitably-coupled source such as a capacitively coupled source.

In the configuration of FIG. 7, the annular conductor is a broken annular conductor 22b, having (in the illustrated example) eight gaps 30. The gaps 30 define capacitive elements that affect the first magnetic resonance frequency of the uniform mode more than the second magnetic resonance frequency of the sinusoidal mode. Accordingly, in this arrangement, the second magnetic resonance frequency corresponding to the sinusoidal mode is suitably selected by designing the parameters D, W, dielectric constant $\in_r$ and thickness H, and the capacitance elements 30 are selected to adjust the first magnetic resonance frequency corresponding to the uniform mode. While gaps 30 in a microstrip transmission line conductor 22b define the capacitance values of the capacitance elements in the embodiment of FIG. 7, in other embodiments discrete capacitors may be used. Accordingly, in this arrangement, geometric design parameters D, W, $\in_r$, and H. affect both the first magnetic resonance frequency of the uniform mode and the second magnetic resonance frequency of the sinusoidal mode. The tuning design is suitably performed in conjunction with an electromagnetic simulator, by iteratively adjusting the capacitance values and one or more parameters of D, W, $\in_r$, and H until the desired first and second magnetic resonance frequencies are achieved.

In the configuration of FIG. 8, the annular conductor is again a broken annular conductor 22c, having (in the illustrated example) eight gaps 30 defining capacitive elements that affect the first magnetic resonance frequency of the uniform mode more than the second magnetic resonance frequency of the sinusoidal mode. Additionally, series inductive elements 32, such as discrete inductors, are included. The inductive elements 32 affect the second magnetic resonance frequency of the sinusoidal mode more than the first magnetic resonance frequency of the uniform mode. Accordingly, in this arrangement, the geometric design parameters D, W, $\in_r$, and H can be first determined for best fit to a loading subject. The tuning design is then suitably performed in conjunction with an electromagnetic simulator, by iteratively adjusting the inductance and capacitance values until the desired first and second magnetic resonance frequencies are achieved.

With reference to FIG. 9, a surface coil similar to that shown in FIG. 8 is described. The surface coil of FIG. 9 includes the annular conductor 22c and also includes an additional concentric and co-planar annular conductor 22d. In FIG. 9, annular conductor 22d is of a slightly smaller radius than the annular conductor 22c. The annular conductors 22c, 22d have similar topologies including eight gaps in each annular conductor, and the ground plane 26 provides shielding for both annular conductors 22c, 22d. Capacitive elements are used to tune one annular conductor to a first magnetic resonance frequency of the uniform mode. Series inductive elements, such as discrete inductors, are used to tune the other annular conductor to a second magnetic resonance frequency of the sinusoidal mode. In a multi-nuclear imaging or spectroscopy application of the surface coil of FIG. 9, the uniform mode is used for one of the loops at a lower multi-nuclear frequency and a sinusoidal mode is used for the other loop at a higher frequency, such as the $^1$H frequency. In other contemplated applications, the surface coil of FIG. 9 is driven in quadrature with both annular conductors 22c, 22d resonating at the same frequency. In a suitable approach, the inner annular conductor 22d is driven via a port P1 while the outer annular conductor is driven via a port P2 with a 90° phase shift.

The two illustrated annular conductors 22c, 22d are coplanar (making them equidistant from the subject) and concentrically arranged. However, the disclosed operational modes, such as quadrature or multi-nuclear resonance modes, are also achievable using annular conductors arranged in spaced apart parallel planes, arranged non-concentrically, or arranged both in spaced apart parallel planes and non-concentrically. In one contemplated embodiment, a generally planar radio frequency coil includes two annular conductors supporting the uniform and sinusoidal current distributions, respectively. In such a radio frequency coil, it is contemplated for the two annular conductors to have the same radius, but to be arranged in spaced apart parallel planes. Such annular conductors may be either concentric or non-concentric.

With reference to FIGS. 10 and 11, further improved resonance quality (i.e., higher resonance Q) can be obtained by having a more enclosing dielectric substrate 34 supporting a more enclosing a radio frequency shield 36 that includes a planar radio frequency shield 36a, similar to the ground plane 26, that is disk shaped (as shown) or annular (similar to the ground plane 26), and that further includes a transverse annular (short cylinder) radio frequency shield portion 36b extending transverse to the planar radio frequency shield 36a and surrounding at least an outer perimeter of the annular conductor 22. Improvements in the Q are higher when the shield 36b extends to the upper plane of the annular conductor 22 or further. The conductive loop portion 22 can also be attached to the short cylinder 36b as opposed to the backing disk 36a. Alternatively, the more enclosing dielectric substrate 34 can be omitted, and a self-supporting annular shield portion can be used.

With reference to FIG. 12, the calculated effect of increasing shielding on the resonance quality Q is illustrated. FIG. 12 plots calculated transverse $B_1$ field versus frequency at a point 10 centimeters above a 15-centimeter radius circular annular conductor for (i) an unshielded annular conductor ("ring-only"); (ii) an annular conductor shielded by a planar radio frequency shield ("ring+planar shield"); and (iii) an annular conductor shielded by both a planar radio frequency shield and by a transverse annular or short cylindrical shield portion ("ring+planar shield+transverse annular shield portion"). A substantial narrowing of the resonant peak is obtained for each increase in shielding, i.e. between the unshielded annular conductor and the annular conductor with ground plane, and between the annular conductor with ground plane and the addition of the transverse annular shield portion. Simulations indicate that most of the improvement through addition of the transverse annular shield portion are obtained when the added transverse shield portion extends a distance equal to or slightly greater than the height of the annular conductor 22.

A doubly resonant single loop surface coil as described was modeled using electromagnetic modeling software. The modeled surface coil included a circular annular conductor similar to that of FIG. 8 and having the cross-section shown in FIG. 5. The modeled coil had a diameter D=28 centimeters (radius R=14 centimeters), a width W=1 centimeter for the annular conductor, and a dielectric substrate having thickness H=1.5 centimeters (see FIG. 5 for dimensional definitions) and dielectric constant $\in_r$=2.1. The modeled coil had eight capacitance elements 30 in series with inductive elements 32 tuned to support a uniform current density at a first magnetic resonance frequency of 120.7 MHz (corresponding to $^{31}$P in a 7 Tesla static $B_0$ magnetic field) and tuned to support a sinusoidal current density at a second magnetic resonance frequency of 298 MHz (corresponding to $^1$H in a 7 Tesla static $B_0$ magnetic field).

FIGS. 13 and 14 plot the current distribution magnitude for the uniform mode (FIG. 13) and for the sinusoidal mode (FIG. 14). In FIGS. 13 and 14, a higher current density magnitude is indicated by a whiter area. The uniform mode shows a uniform annular current distribution as expected. The sinusoidal mode shows the expected two current distribution nulls, and two current distribution maxima corresponding to $+I_{max}$ and $-I_{max}$, again as expected.

FIG. 15 plots calculated $S_{11}$ (that is, reflected power) versus frequency. The uniform and sinusoidal modes are clearly seen as sharp negative valleys in the $S_{11}$ plot at 120.7 MHz and 298 MHz, respectively.

FIG. 16 plots calculated $|B_1^+|(x)$ normalized to the value of $|B_1^+|(x=1$ centimeter) versus position along the loop axis direction in an average brain tissue ($\sigma$=0.55 S/m, $\in_r$=52) which is placed 1 centimeter above the annular conductor. Note that in FIG. 16, the filled circles corresponding to the plot for the sinusoidal mode are merely differentiating indicators, and do not indicate individual calculated points. The plot of FIG. 16 shows a typical ring $|B_1^+|$-field profile where the $|B_1^+|$-field decreases with the depth. This doubly-tuned coil is suitable for near surface multi-nuclear imaging and spectroscopy.

A conventional, uniform current, multi-nuclear surface coil is constructed by combining two or more separate loops resonating at different frequencies. In such an arrangement, the two separate loops can couple with each other unless appropriately trapped and/or geometrically configured to reduce coupling. An advantage of the doubly-tuned single loop coil disclosed herein is that since both uniform and sinusoidal modes are supported by the same annular conductor, coil-coil coupling is not a concern. Indeed, the uniform and sinusoidal modes are operatively independent.

Additionally, the single doubly-tuned annular conductor is simpler to construct, and includes fewer parts, than a dual coil having separate resonating loops. Yet a further advantage is that the sinusoidal mode can be fed in quadrature to increase transmit and receive efficiency for $^1$H imaging, while the uniform current mode used for the $^{31}$P or other nuclear species is driven linearly. The usefulness of the sinusoidal quadrature drive will depend on the orientation of the coil with respect to the $B_0$ field.

With reference back to FIG. 1, the $B_1$ fields should be generally transverse to the static magnetic field $B_0$ to maximize the excited or detected magnetic resonance. Accordingly, as shown in FIG. 1, the annular conductor 22 should be arranged such that $B_{1,uniform}$ is generally transverse to the static magnetic field $B_0$. This is suitably achieved by arranging the surface coil 20 such that the static magnetic field $B_0$ is generally parallel with the plane of the annular conductor 22. The sinusoidal $B_{1,sine}$ field will substantially be in a plane that includes the z axis aligned with the $B_0$ field. Each of $B_{1,uniform}$ and $B_{1,sine}$ will function as a linear coil for nuclear magnetic resonance (NMR), rather than as a rotating field quadrature coil. Alternatively, quadrature operation can be achieved by using two co-planar loops as described with reference to FIG. 9. In another described approach, the loop plane is oriented generally orthogonal to the z axis as is the case for annular loop 22' of FIG. 1. This orientation also assures that the sinusoidal $B_{1,sine}$ field is generally transverse to the static magnetic field $B_0$. In this orientation a loop $B_{1,uniform}$ mode is not useful for NMR. It is envisioned that various loop orientations and combinations of modes may be used.

If the first and second magnetic resonance frequencies are the same, for example using two co-planar loops, then a total transverse $B_1$ field is generated which results from the vector sum of the $B_{1,sine}$ and $B_{1,uniform}$ fields. This transverse field advantageously has less orientation-dependence than does the transverse $B_1$ field of a conventional surface coil operating only in the uniform mode.

Although surface coils are illustrated herein, the disclosed generally planar radio frequency coils can also be used in other applications, such as coil elements of a SENSE coil array or phased coil array, or as a local coil fixed to the bore, or so forth. In a coil array configuration, each coil element may be a generally planar annular conductor, such as the illustrated annular conductors 22, 22a, 22b, 22c, 22d, but the coil array made up of a plurality of such generally planar annular conductor elements may have a non-planar shape, such as a body-fitting shape, a cylindrical shape, or so forth. Moreover, the term "generally planar" as used herein is intended to encompass generally planar annular conductors that have some bowing or curvature, for example to facilitate arrangement of an array of such generally planar annular conductor elements in a desired torso-fitting, cylindrical, or other non-planar shape.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A generally planar radio frequency coil comprising:
a single annular conductor arranged generally parallel with a coil plane of the generally planar radio frequency coil and configured to support both (i) a uniform electrical current distribution generating a first $B_1$ field at a first magnetic resonance frequency directed out of the coil plane and (ii) a sinusoidal electrical current distribution generating a second $B_1$ field at a second magnetic resonance frequency directed parallel with the coil plane, wherein the second magnetic resonance frequency is higher than the first magnetic resonance frequency.

2. A generally planar radio frequency coil comprising:
one or two annular conductors arranged generally parallel with a coil plane of the generally planar radio frequency coil and configured to support (i) a uniform electrical current distribution generating a first $B_1$ field at a first magnetic resonance frequency directed out of the coil plane and (ii) a sinusoidal electrical current distribution generating a second $B_1$ field at a second magnetic resonance frequency directed parallel with the coil plane; and
a generally planar radio frequency shield arranged parallel with the one or two annular conductors.

3. The radio frequency coil as set forth in claim 2, wherein the one or two annular conductors include two annular conductors, one of which is configured to support the uniform current distribution and the other of which is configured to support the sinusoidal current distribution.

4. A magnetic resonance scanner incorporating at least one generally planar radio frequency coil set forth in claim 3.

5. The radio frequency coil as set forth in claim 3, wherein the second magnetic resonance frequency is higher than the first magnetic resonance frequency.

6. The radio frequency coil as set forth in claim 3, wherein the first magnetic resonance frequency and the second magnetic frequency are the same, and the two annual conductors define a quadrature surface coil.

7. The radio frequency coil as set forth in claim 3, wherein the two annular conductors are concentric and co-planar.

8. The radio frequency coil as set forth in claim 2, wherein the generally planar radio frequency shield is one of disk-shaped and annular.

9. The radio frequency coil as set forth in claim 2, further including:
a transverse annular radio frequency shield portion extending transverse to the generally planar radio frequency shield and surrounding at least an outer perimeter of the one or two annular conductors.

10. A magnetic resonance scanner incorporating at least one generally planar radio frequency coil set forth in claim 2.

11. A radio frequency coil comprising:
an annular conductor configured to support:
(i) a uniform electrical current distribution generating a first $B_1$ field at a first magnetic resonance frequency directed out of a plane of the annular conductor, and
(ii) a sinusoidal electrical current distribution generating a second $B_1$ field at a second magnetic resonance frequency directed parallel with the plane of the annular conductor;
wherein the second magnetic resonance frequency is higher than the first magnetic resonance frequency.

12. The radio frequency coil as set forth in claim 11, wherein the first magnetic resonance frequency corresponds to magnetic resonance of a first nuclear species in a selected static magnetic field, and the second magnetic resonance frequency corresponds to magnetic resonance of a second nuclear species in the selected static magnetic field.

13. The radio frequency coil as set forth in claim 12, wherein the second magnetic resonance frequency corresponds to the $^1$H magnetic resonance in the selected static magnetic field.

14. The radio frequency coil as set forth in claim 13, wherein the first magnetic resonance frequency corresponds to the magnetic resonance of a nuclear species selected from the group consisting of $^{19}$F, $^{13}$C, $^{23}$Na, and $^{31}$P in the selected static magnetic field.

15. The radio frequency coil as set forth in claim 12, wherein the selected static magnetic field is greater than 3 Tesla.

16. The radio frequency coil as set forth in claim 11, wherein the annular conductor includes:
one or more elements having capacitance effective to tune the annular conductor to support a uniform electrical current distribution generating a first $B_1$ field at the first magnetic resonance frequency directed out of the plane of the annular conductor; and
one or more elements having inductance effective to tune the annular conductor to support a sinusoidal electrical current distribution generating a second $B_1$ field at the second magnetic resonance frequency directed parallel with the plane of the annular conductor.

17. The radio frequency coil as set forth in claim 11, wherein the annular conductor has a width and annular diameter and is spaced apart from a ground plane by a dielectric layer of dielectric width and dielectric constant, and further includes one or more capacitive elements, wherein the width, annular diameter, dielectric width, dielectric constant, and capacitive elements are effective to tune the annular conductor to support the uniform and sinusoidal electrical current distributions at selected respective first and second magnetic resonance frequencies.

18. The radio frequency coil as set forth in claim 11, wherein the annular conductor includes an annular microstrip transmission line.

19. The radio frequency coil as set forth in claim 18, wherein the microstrip annular microstrip transmission line includes one or more gaps defining capacitances effective to tune the annular conductor to support a uniform electrical current distribution generating a first $B_1$ field at the first magnetic resonance frequency directed out of the plane of the annular conductor.

20. The radio frequency coil as set forth in claim 11, further including:

a dielectric substrate on which the annular conductor is disposed; and a ground plane disposed on a side of the dielectric substrate opposite the annular conductor.

21. A magnetic resonance scanner incorporating the radio frequency coil set forth in claim 11.

22. A magnetic resonance scanner comprising:

a magnet generating a static magnetic field;

a magnetic field gradient system configured to superimpose selected magnetic field gradients on the static magnetic field; and a single annular conductor configured to support both (i) a sinusoidal electrical current distribution generating or induced by a $B_1$ field at a magnetic resonance frequency directed parallel with the plane of the annular conductor and (ii) a uniform electrical current distribution generating or induced by a $B_1$ field at a magnetic resonance frequency directed out of a plane of the annular conductor.

23. The magnetic resonance scanner as set forth in claim 22, wherein a plane of the single annular conductor is arranged generally parallel with the static magnetic field.

* * * * *